(12) United States Patent
Kono et al.

(10) Patent No.: US 6,377,074 B1
(45) Date of Patent: Apr. 23, 2002

(54) SEMICONDUCTOR DEVICE HAVING A CONSTANT-CURRENT SOURCE CIRCUIT

(75) Inventors: Takashi Kono; Katsuyoshi Mitsui, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/521,418

(22) Filed: Mar. 8, 2000

(30) Foreign Application Priority Data

Aug. 27, 1999 (JP) ............................................. 11-240814

(51) Int. Cl.[7] ......................................... H03K 19/0175
(52) U.S. Cl. .............................. 326/82; 326/31; 326/32
(58) Field of Search .............................. 326/32, 33, 34, 326/31, 82, 83; 327/52–55, 72, 73

(56) References Cited

U.S. PATENT DOCUMENTS 5,189,316 A  *  2/1993 Murakami et al. ........ 307/296.1
5,389,833 A  *  2/1995 Kay ............................. 327/96
5,729,154 A  *  3/1998 Taguchi et al. ................ 326/30
6,147,479 A  * 11/2000 Lee ............................. 323/313

FOREIGN PATENT DOCUMENTS

JP          5-211431          8/1993
JP          6-232744          8/1994

* cited by examiner

*Primary Examiner*—Michael Tokar
*Assistant Examiner*—Anh Q. Tran
(74) *Attorney, Agent, or Firm*—McDermott, Will & Emery

(57) ABSTRACT

In the present semiconductor integrated circuit device, a buffer is provided between a constant-current source circuit and an internal circuit that becomes a source of noise. The buffer controls the potential of an output node such that the potential of the output node becomes the bias potential. Even when noise is generated on the bias potential line when the internal circuit is in operation, the buffer dampens the noise. Thus, the noise generated in the internal circuit is prevented from adversely affecting the constant-current source circuit, and a stable operation of the internal circuit itself is achieved.

9 Claims, 11 Drawing Sheets

SEMICONDUCTOR DEVICE HAVING A CONSTANT-CURRENT SOURCE CIRCUIT

BACKGROUND OF THE INVENTION

1. Field of the Invention

The present invention relates to a semiconductor device, and more specifically, to a semiconductor device having an internal circuit that performs a prescribed operation based on a constant current generated by a constant-current source circuit.

2. Description of the Background Art

Conventionally, in a semiconductor integrated circuit device such as a DRAM (Dynamic Random Access Memory), an SRAM (Static Random Access Memory), or the like, a constant-current source circuit is provided that is less likely to be affected by variations of an external power-supply potential extVdd or by process variations (variations of a threshold voltage of an MOS transistor). The constant current generated by the constant-current source circuit is transmitted to various internal circuits via a current mirror circuit. Each internal circuit performs a prescribed operation based on the transmitted constant current. Thus, a semiconductor integrated circuit device that is less likely to be affected by variations of an external power-supply potential extVdd or by process variations is realized.

FIG. 14 is a block diagram representing the main portion of a conventional semiconductor integrated circuit device. In FIG. 14, the semiconductor integrated circuit device is provided with a constant-current source circuit 81 and a plurality (four in the figure) of internal circuits 82 to 85.

Constant-current source circuit 81 includes resistance element 91 and 92, a capacitor 93, P-channel MOS transistors 94 and 95, and N-channel MOS transistors 96 and 97, as shown in FIG. 15. Resistance element 91 and capacitor 93 are connected in series between an external power-supply potential extVdd line and a ground potential GND line, forming a low pass filter. MOS transistors 94 and 96, resistance element 92, and MOS transistors 95 and 97 are respectively connected in series between a node N91 between resistance element 91 and capacitor 93 and a ground potential GND line. Gates of P-channel MOS transistors 94 and 95 are both connected to the drain of P-channel MOS transistor 94. Gates of N-channel MOS transistors 96 and 97 are both connected to the drain of N-channel MOS transistor 97. N-channel MOS transistors 96 and 97 together form a current mirror circuit.

The high frequency noise on an external power-supply potential extVdd line is removed by the low pass filter formed by resistance element 91 and capacitor 93 so that external power-supply potential extVdd devoid of the high frequency noise is provided to node N91. P-channel MOS transistors 94 and 95 are both set to operate in a sub-threshold region, and the current mirror circuit formed by N-channel MOS transistors 96 and 97 allows currents Ic of the same value to flow through P-channel MOS transistors 94 and 95.

A gate width W2 of P-channel MOS transistor 95 is set to be greater than a gate width W1 of P-channel MOS transistor 94 so that a voltage difference dV is created between P-channel MOS transistors 94 and 95 in gate-source voltages Vgs required to allow currents Ic of the same value to flow through P-channel MOS transistors 94 and 95. This voltage dV is ideally $dV = k \times T/q \times \ln(W2/W1)$. Here, k indicates the Boltzmann's constant, T indicates the absolute temperature, and q indicates the amount of charge of electrons. Therefore, dV is proportional to absolute temperature T. In addition, if the resistance value of resistance element 92 is indicated by R, then Ic=dV/R. Here, if the temperature dependency of R is negligible, Ic is proportional to absolute temperature T. Thus, the temperature characteristic of Ic is positive.

This Ic, being less likely to be affected by variations of an external power-supply potential extVdd or by process variations, is used in various internal circuits 82 to 85 within the semiconductor integrated circuit device. A gate potential of P-channel MOS transistors 94 and 95 is provided as a bias potential VBH to gates of P-channel MOS transistors of internal circuits 82 and 83, and a constant current Ic flows through internal circuits 82 and 83. Moreover, a gate potential of N-channel MOS transistors 96 and 97 is provided as a bias potential VBL to gates of N-channel MOS transistors of internal circuits 84 and 85, and constant current Ic flows through internal circuits 84 and 85.

A reference potential generating circuit 100 as shown in FIG. 15, for example, is provided to an internal circuit 83. Reference potential generating circuit 100 includes P-channel MOS transistors 101 to 104 connected in series between an external power-supply potential extVdd line and a ground potential GND line. P-channel MOS transistor 101 is equal in size to P-channel MOS transistor 94. The gate of P-channel MOS transistor 101 receives bias potential VBH generated by constant-current source circuit 81. Gates of P-channel MOS transistors 102 and 103 are both connected to the drain of P-channel MOS transistor 103. The gate of P-channel MOS transistor 104 is grounded. The drain of P-channel MOS transistor 101 becomes an output node N101.

P-channel MOS transistors 102 and 103 each operate as a resistance element. P-channel MOS transistor 104 is large enough for Ic and operates as a diode. P-channel MOS transistor 101 and P-channel MOS transistor 94 of constant-current source circuit 81 form a current mirror circuit so that constant current Ic flows through P-channel MOS transistors 101 to 104 of reference potential generating circuit 100. If the total resistance value of P-channel MOS transistors 102 and 103 is R102, and the threshold voltage of P-channel MOS transistor 104 is Vt104, a reference potential VR=Ic×R102+Vt104 would be output from output node N101.

Here, Ic×R102 takes on the positive temperature characteristic of Ic, while the temperature characteristic of Vt104 is negative. By setting the positive temperature characteristic of Ic×R102 and the negative temperature characteristic of Vt104 to balance out, the temperature characteristic of reference potential VR can be cancelled. Otherwise, either one of resistance value component Ic×R102 and threshold component Vt104 can be made dominant so that reference potential VR indicates either the positive or the negative temperature characteristic.

Reference potential VR is used as a reference when generating various internal potentials, such as an internal power-supply potential intVdd that is lower than an external power-supply potential extVdd, and a boosted potential Vpp for transmitting the exact high data level by keeping the resistance value of an N-channel MOS transistor in its conductive state sufficiently small.

Internal circuit 84 is provided with a Vbb level detection circuit 110 as the one shown in FIG. 16, for example. Vbb level detection circuit 110 includes P-channel MOS transistors 111, 112, N-channel MOS transistors 113 to 117, fuses 118 to 120, and a comparator 121. MOS transistors 111, 113 to 116 are connected in series between an external power-supply potential extVdd line and a substrate potential Vbb line. MOS transistors 112, 117 are connected in series between an external power-supply potential extVdd line and a ground potential GND line.

Gates of P-channel MOS transistors 111, 112 are both connected to the drain (node N111) of P-channel MOS transistor 111. P-channel MOS transistors 111 and 112 form a current mirror circuit. Gates of N-channel MOS transistors 113, 117 receive bias potential VBL generated in constant-current source circuit 81. Gates of N-channel MOS transistors 114 to 116 are all grounded. Fuses 118 to 120 are connected in parallel to N-channel MOS transistors 114 to 116, respectively.

Comparator 121 compares the potential of node N111 with the potential of a node N112 to output a charge pump activating signal φC. When the potential of node N111 is higher than the potential of node N112, signal φC attains the active level, or the logic high or "H" level, whereas when the potential of node N111 is lower than the potential of node N112, signal φC attains the inactive level, or the logic low or "L" level.

N-channel MOS transistors 114 to 116 each operate as a resistance element. If the resistance value between a node N113 and a substrate potential Vbb line is Rb, the potential of the source (node N113) of N-channel MOS transistor 113 attains ground potential GND when Vbb=Rb×Ic, whereby the potentials of node N111 and node N112 become equal. Resistance value Rb can be regulated by blowing or not blowing fuses 118 to 120.

When substrate potential Vbb is higher than the set value (−Rb×Ic), the potential of node N113 becomes higher than ground potential GND, and the current that flows through N-channel MOS transistor 113 becomes smaller than constant current Ic. Currents of the same value flow through MOS transistors 111 to 113, respectively, while N-channel MOS transistor 117 can conduct a current Ic greater than the current that flows through each one of MOS transistors 111 to 113. Thus, the potential of node N111 becomes higher than the potential of node N112, and charge pump activating signal φC attains the active level, or the "H" level. Accordingly, a charge pump circuit 122 ejects positive charges from the substrate (or feeds negative charges into the substrate), reducing substrate potential Vbb.

When substrate potential Vbb is lower than the set value (−Rb×Ic), the potential of node N113 becomes lower than a ground potential GND, and the current that flows through N-channel MOS transistor 113 becomes greater than constant current Ic. Currents of the same value flow through MOS transistors 111 to 113, respectively, and current Ic that can flow through N-channel MOS transistor 117 is smaller than the current that flows through each of MOS transistors 111 to 113. Thus, the potential of node N112 becomes higher than the potential of node N111, and charge pump activating signal φC attains the inactive level, or the "L" level, whereby the charge pump circuit 122 is rendered inactive. Accordingly, substrate potential Vbb is held at the set value (−Rb×Ic). Further, while substrate potential Vbb is proportional to absolute temperature T when employing a Vbb level detection circuit 110 of FIG. 16, the temperature characteristic of substrate potential Vbb can be controlled by connecting a diode in series with N-channel MOS transistors 114 to 116, as described in relation to reference potential generating circuit 100 of FIG. 15.

Moreover, internal circuit 82 is provided with a ring oscillator 130 as the one shown in FIG. 17, for example. Ring oscillator 130 includes N stages (N is an odd number) of inverters 131.1 to 131.N connected in a ring-like manner, and P-channel MOS transistors 134.1 to 134.N each connected between an external power-supply potential extVdd line and the respective power-supply node of inverters 131.1 to 131.N. Each of inverters 131.1 to 131.N includes a P-channel MOS transistor 132 and an N-channel MOS transistor 133 connected in series between a power-supply node and a ground potential GND line.

The drivability of each of inverters 131.1 to 131.N is determined by current Ic that can flow through P-channel MOS transistors 134.1 to 134.N. Since current Ic is not dependent on variations of an external power-supply potential extVdd or on process variations, ring oscillator 130 provides oscillation at a stable frequency.

In addition, the temperature characteristic of the frequency of an output clock signal CLK of ring oscillator 130, like the constant current, is positive. Thus, ring oscillator 130 is advantageously used as a ring oscillator for determining the frequency of a self-refresh operation in a DRAM.

Since, in general, the period for which DRAM holds data is shorter when the temperature is higher, it is desirable that the refresh frequency becomes higher as the temperature becomes higher. With a ring oscillator having a plurality of inverters merely connected in the shape of a ring, however, the oscillation frequency becomes lower as the temperature increases. Consequently, if the frequency was set at a high temperature, the frequency becomes extremely high at a low temperature, and the refresh operation is performed more often than necessary, requiring a greater dissipation current. On the other hand, with ring oscillator 130 shown in FIG. 17, the temperature characteristic of the oscillation frequency is positive so that it matches the temperature characteristic of the DRAM's period for holding data.

In addition, bias potentials VBH and VBL are utilized to limit the through current of a circuit to a small value by taking advantage of the small constant current Ic.

Since the constant current Ic generated in constant-current source circuit 81 is generally of a very small value (for instance, on the order of 1 μA) and since the circuit forms a closed loop, noise countermeasures are requisite. The use of a low pass filter described in relation to FIG. 15 also is one of the noise countermeasures. Moreover, such countermeasures are taken as shortening the lengths of the lines of bias potentials VBH and VBL between constant-current source circuit 81 and internal circuits 82 to 85 as well as shielding of these lines.

These countermeasures, however, are not always sufficient. Let us consider, for instance, the operation of Vbb level detection circuit 110 of FIG. 16 upon power-on. While the power is off, substrate potential Vbb is substantially at a ground potential GND. When power is provided, constant-current source circuit 81 starts to operate before any of the other circuits. This is due to the fact that, since constant current Ic is utilized in a number of circuits, in order for these circuits to perform a normal operation, it is necessary for the operation of constant-current source circuit 81 quickly to settle to its steady state. Then, Vbb level detection circuit 110 decides that substrate potential Vbb is high, and causes the charge pump circuit to operate. Since the load capacitance of substrate potential Vbb is extremely large and substrate potential Vbb is required to have attained a normal level approximately 200 μs after the power-on, the charge pump circuit is set to have a great charge-supplying ability. Thus, substrate potential Vbb is pulled down at a significant speed.

At this time, bias potential VBL line and substrate potential Vbb line are coupled by the parasitic capacitance of N-channel MOS transistor 113 (capacitance resulting between substrates or resulting from the source and the drain overlapping the gate), and the VBL line is pulled toward the direction of ground potential GND. As a result, constant-current source circuit 81 may no longer be able to conduct the current, and a significantly long time may be required before the entire semiconductor integrated circuit device starts to operate stably.

Moreover, when ring oscillator 130 of FIG. 17 is not driven steadily but is driven only upon receiving some kind of activating signal, the dissipation current in ring oscillator 130 greatly varies in time, and noise is introduced to bias potential VBH.

SUMMARY OF THE INVENTION

The main object of the present invention is to provide a semiconductor device that prevents the noise generated in an internal circuit from adversely affecting a constant-current source circuit and that allows a stable operation of the internal circuit itself.

To put it simply, according to the present invention, a buffer circuit is provided between a constant-current source circuit and an internal circuit, for receiving at an input node an output potential of the constant-current source circuit to control the potential of an output node such that the potential of the output node is the same as that of the input node. Thus, the noise generated in an internal circuit is dampened by the buffer circuit so that the noise generated in the internal circuit is prevented from adversely affecting the constant-current source circuit and the stable operation of the internal circuit itself is achieved.

Preferably, a setting circuit is further provided for selectively setting a path to provide a bias potential that is output from the constant-current source circuit to an internal circuit via the buffer circuit or a path to provide the bias potential directly to the internal circuit without the intervention of the buffer circuit. In this case, the buffer circuit is used only when required so that no unnecessary current is dissipated wastefully.

Preferably, the setting circuit includes a first fuse connected between an input node and an output node of the buffer circuit and a second fuse for activating the buffer circuit when blown. In this case, the setting circuit is easily configured.

Preferably, a control circuit is further provided that sets the drivability of the buffer circuit, which can be switched between at least two levels of high and low, at a high level during the noise generation period or the period during which noise is generated in an internal circuit, and at a low level during other times. In this case, the dampening of the generated noise is ensured, and the dissipation current can be reduced.

Preferably, the noise generation period of an internal circuit is the period from the time when an external power-supply potential is provided to the semiconductor device up to the time when an internal power-supply potential attains a predetermined potential level. In this case, the constant-current source circuit and the like are prevented from being adversely affected by the noise generated at power-on.

Preferably, the semiconductor device is formed on a semiconductor substrate and is further provided with a potential detection circuit for detecting whether or not the potential of the semiconductor substrate exceeds a predetermined target potential and for outputting an activating signal when the potential of the semiconductor substrate has not exceeded a predetermined target potential, and a charge pump circuit for supplying charges to the semiconductor substrate corresponding to the outputting of the activating signal from the potential detection circuit. The noise generation period of an internal circuit is the period during which the activating signal is being output from the potential detection circuit. In this case, the constant-current source circuit and the like are prevented from being adversely affected by the noise generated while the charge pump circuit is driven.

Preferably, a first capacitor and a second capacitor are further provided, connected between an input node or an output node of a buffer circuit and a reference potential line, respectively. In this case, the rapid change in the potentials of the input node and the output node of the buffer circuit can be prevented so that input and output of the buffer circuit can be stabilized.

Preferably, the buffer circuit includes a first transistor having an input electrode connected to an input node, a second transistor having an input electrode and a first electrode connected to an output node, a current mirror circuit for providing to an output node a current having the same value as the current that flows through the first transistor, and a resistance element for limiting a sum of the currents flowing through the first and second transistors to a prescribed value. In this case, the buffer circuit is easily configured.

Preferably, a plurality of internal circuits are provided, and the plurality of internal circuits are divided into a plurality of groups according to the noise generation period and the types of the noise generated. The buffer circuit is provided corresponding to each of these groups, and transmits an output potential of a constant-current source circuit to each internal circuit belonging to a corresponding group. In this case, the noise generated in a group of internal circuits can be prevented from adversely affecting the internal circuits of another group.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
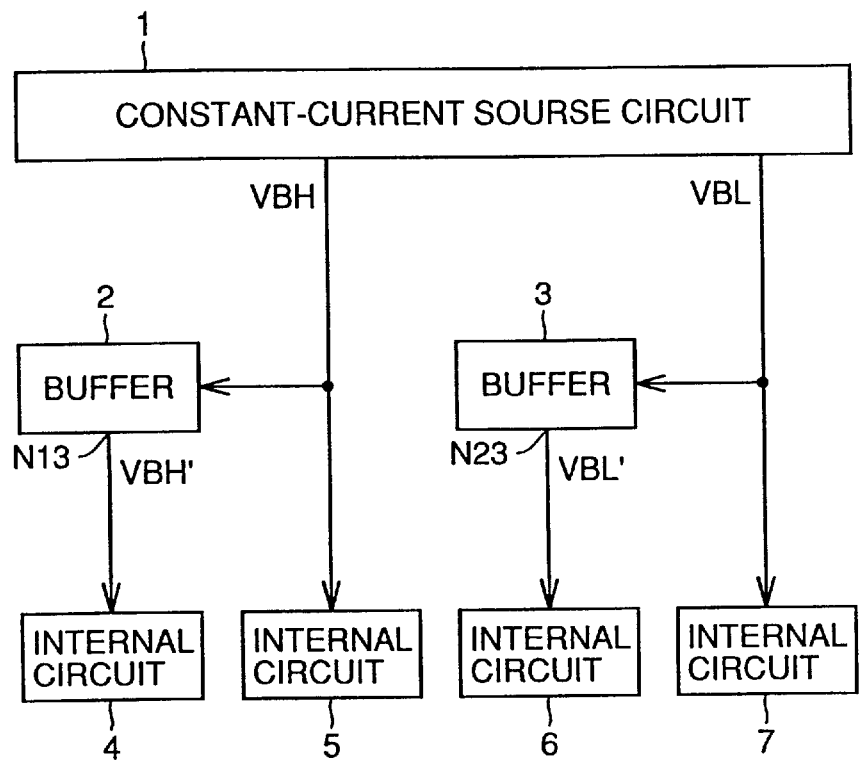
FIG. 1 is a block diagram representing a main portion of a semiconductor integrated circuit device according to a first embodiment of the present invention.

FIG. 1 is a block diagram representing a main portion of a semiconductor integrated circuit device according to a first embodiment of the present invention. In FIG. 1, the semiconductor integrated circuit device is provided with a constant-current source circuit 1, buffers 2 and 3, and internal circuits 4 to 7. Constant-current source circuit 1 has the same configuration as constant-current source circuit 81 shown in FIG. 15, and generates bias potentials VBH and VBL.

Figure 2:
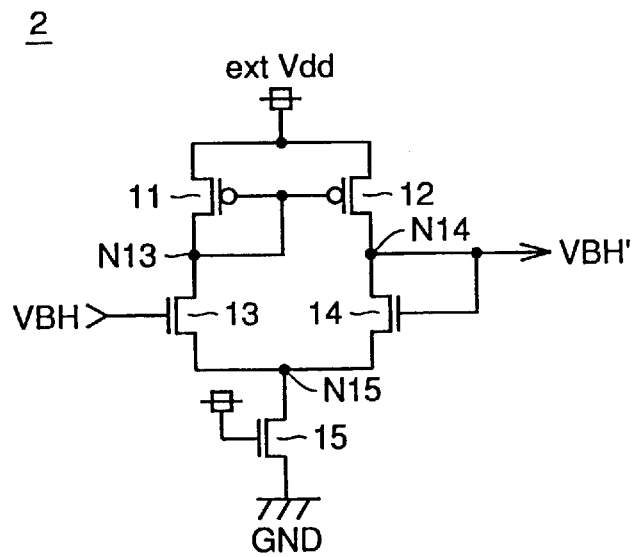
FIG. 2 is a circuit diagram representing a configuration of a buffer 2 shown in FIG. 1.

Buffer 2 includes P-channel MOS transistors 11, 12 and N-channel MOS transistors 13 to 15 as shown in FIG. 2. MOS transistors 11 and 13, and 12 and 14 are respectively connected in series between an external power-supply potential extVdd line and a node N15. Gates of P-channel MOS transistors 11, 12 are both connected to the drain (a node N13) of P-channel MOS transistor 11. P-channel MOS transistors 11, 12 form a current mirror circuit. The gate of N-channel MOS transistor 13 receives bias potential VBH. N-channel MOS transistor 14 has a gate connected to the drain (an output node N14). N-channel MOS transistor 15 is connected between a node N15 and a ground potential GND line, and receives an external power-supply potential extVdd at a gate. N-channel MOS transistor 15 operates as a resistance element.

N-channel MOS transistor 13 and P-channel MOS transistor 11 are connected in series, and P-channel MOS transistors 11 and 12 form a current mirror circuit so that currents of the same value flow through MOS transistors 11, 12, and 13. When a potential VBH' of output node N14 is higher than bias potential VBH, the drive current of N-channel MOS transistor 14 becomes greater than the drive current of N-channel MOS transistor 13 so that the differential current flows out from output node N14 causing output node N14 to be discharged. Thus, output potential VBH' falls. When potential VBH' of output node N14 is lower than bias potential VBH, the drive current of N-channel MOS transistor 13 becomes greater than the drive current of N-channel MOS transistor 14 so that the differential current flows into output node N14 charging output node N14, and thus, output potential VBH' rises. As a result, output potential VBH' becomes equal to bias potential VBH.

Figure 3:
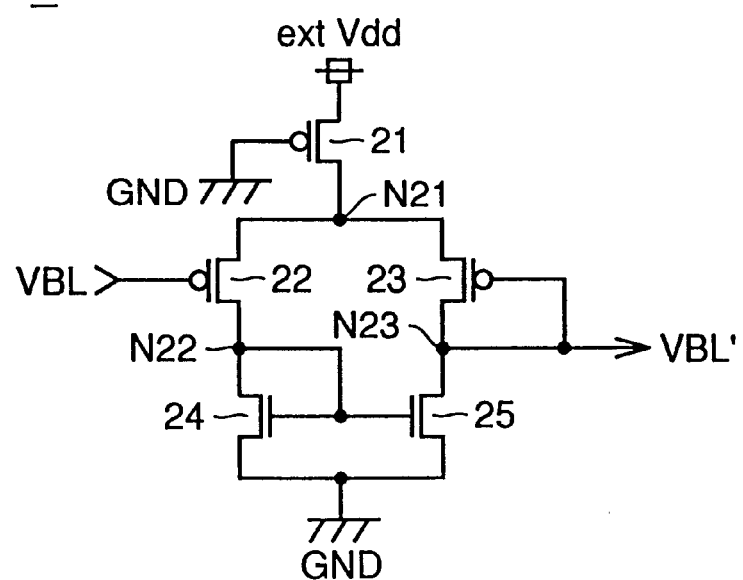
FIG. 3 is a circuit diagram representing a configuration of a buffer 3 shown in FIG. 1.

Buffer 3 includes P-channel MOS transistors 21 to 23 and N-channel MOS transistors 24 and 25 as shown in FIG. 3. P-channel MOS transistor 21 is connected between an external power-supply potential extVdd line and a node N21, and has a gate grounded. P-channel MOS transistor 21 operates as a resistance element. MOS transistors 22 and 24, and 23 and 25 are respectively connected in series between node N21 and a ground potential GND line. The gate of P-channel MOS transistor 22 receives a bias potential VBL. P-channel MOS transistor 23 has a gate connected to the drain (an output node N23). The gates of N-channel MOS transistors 24, 25 are both connected to a drain (a node N22) of N-channel MOS transistor 24. N-channel MOS transistors 24, 25 form a current mirror circuit.

P-channel MOS transistor 22 and N-channel MOS transistor 24 are connected in series, and N-channel MOS transistors 24 and 25 form a current mirror circuit so that currents of the same value flow through MOS transistors 22, 24, and 25. When a potential VBL' of output node N23 is higher than bias potential VBL, the drive current of P-channel MOS transistor 23 becomes smaller than the drive current of P-channel MOS transistor 22 so that the differential current flows out from output node N23 causing output node N23 to be discharged. Thus, output potential VBL' falls. When potential VBL' of output node N23 is lower than bias potential VBL, the drive current of P-channel MOS transistor 23 becomes greater than the drive current of P-channel MOS transistor 22 so that the differential current flows into output node N23 charging output node N23, and thus, output potential VBL' rises. As a result, output potential VBL' becomes equal to bias potential VBL.

Figure 15:
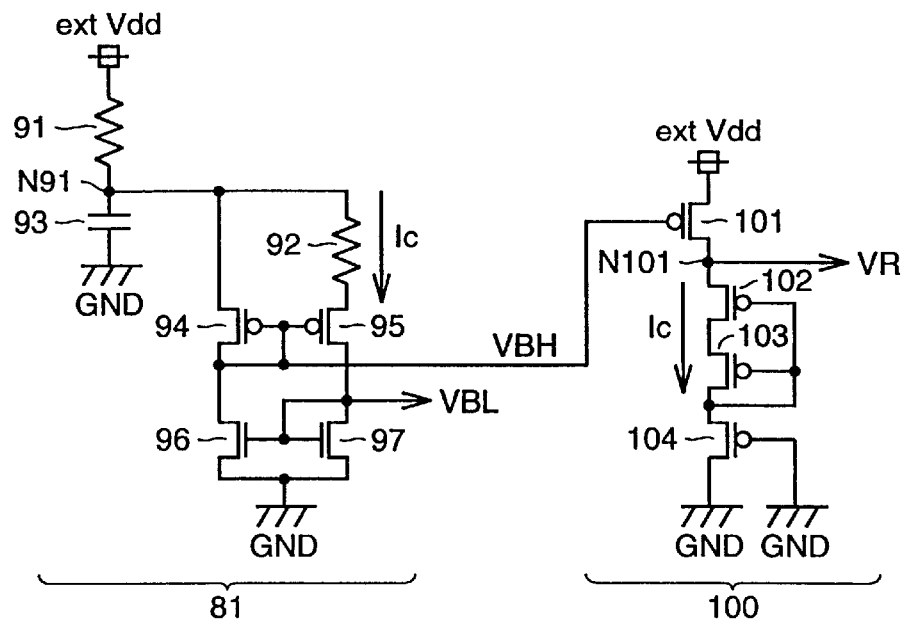
FIG. 15 is a circuit diagram representing a constant-current source circuit shown in FIG. 14 and a reference potential generating circuit included in an internal circuit 83.
Figure 17:
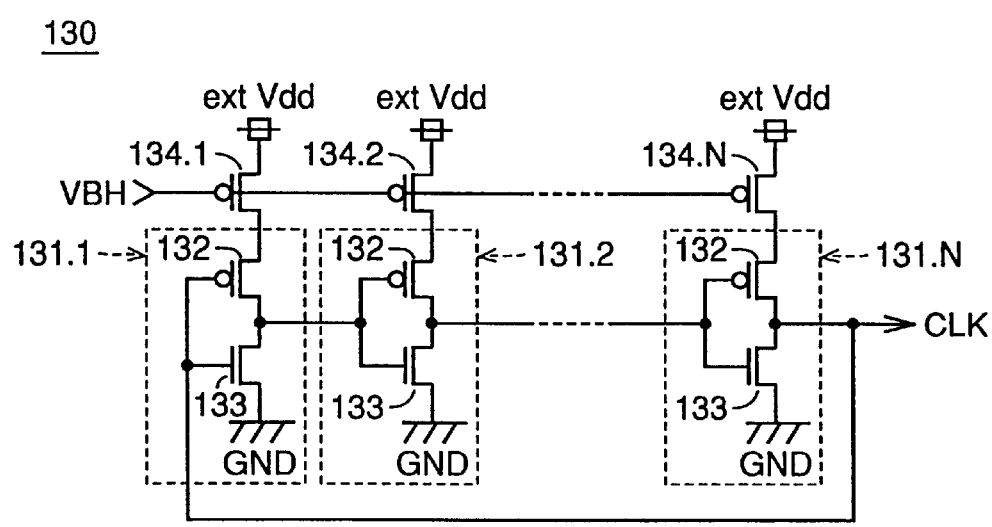
FIG. 17 is a circuit diagram representing a configuration of a ring oscillator included in an internal circuit 82 shown in FIG. 14.

Internal circuit 4 includes a ring oscillator 130 as shown in FIG. 17, for example, and performs a prescribed operation according to output potential VBH' of buffer 2. The noise that is generated on bias potential VBH' line while internal circuit 4 operates is dampened by buffer 2. Internal circuit 5 includes a reference potential generating circuit 100 as shown in FIG. 15, for example, and performs a prescribed operation according to bias potential VBH generated in constant-current source circuit 1. No noise is generated on bias potential VBH line even when internal circuit 5 is in operation.

Figure 16:
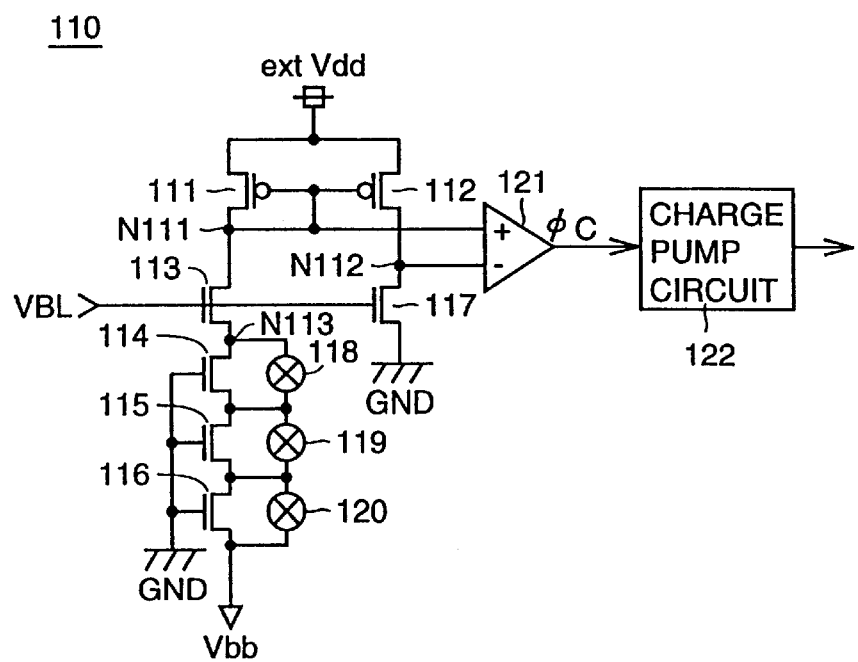
FIG. 16 is a circuit diagram representing a configuration of a Vbb level detection circuit included in an internal circuit 84 shown in FIG. 14.

Internal circuit 6 includes a Vbb level detection circuit as shown in FIG. 16, for example, and performs a prescribed operation according to output potential VBL' of buffer 3. The noise that is generated on bias potential VBL' line while internal circuit 6 operates is dampened by buffer 3. Internal circuit 7 performs a prescribed operation according to bias potential VBL generated in constant-current source circuit 1. No noise is generated on bias potential VBL line even when internal circuit 7 is in operation.

Now, an operation of the semiconductor integrated circuit device will be described briefly. When an external power-supply potential extVdd is provided, bias potentials VBH, VBL are generated by constant-current source circuit 1. Bias potential VBH is provided to internal circuit 4 via buffer 2 as well as directly to internal circuit 5. Bias potential VBL is provided to internal circuit 6 via buffer 3 as well as directly to internal circuit 7.

Internal circuits 4, 5 perform the prescribed operations according to bias potentials VBH' and VBH, respectively. Internal circuits 6, 7 perform the prescribed operations according to bias potentials VBL' and VBL, respectively. The noise that is generated on the lines of bias potentials VBH' and VBL' while internal circuits 4, 6 operate is dampened by buffers 2, 3. Thus, constant-current source circuit 1 and other internal circuits 5 and 7 are prevented from being adversely affected by the noise, while the operations of internal circuits 4 and 6 that are the sources of the noise can be stabilized. No noise is generated on lines of bias potentials VBH' and VBL' even when internal circuits 5, 7 are in operation.

Moreover, it is necessary to set the drivability of buffers 2 and 3 to an appropriate value such that the influence of noise can be suppressed and the dissipation current is kept small. The drivability of buffers 2, 3 can be adjusted by the size of MOS transistors 11 to 15, 21 to 25, particularly by the size of MOS transistors 15 and 21.

Second Embodiment

In the first embodiment, one buffer is provided to each of the internal circuits that becomes a source of the noise. When, however, an internal circuit that is a source of noise includes a plurality of circuits that become sources of noise and when these circuits operate separately, there is a possibility of an operation of one circuit adversely affecting the operations of other circuits. This problem is solved in the second embodiment.

Figure 4:
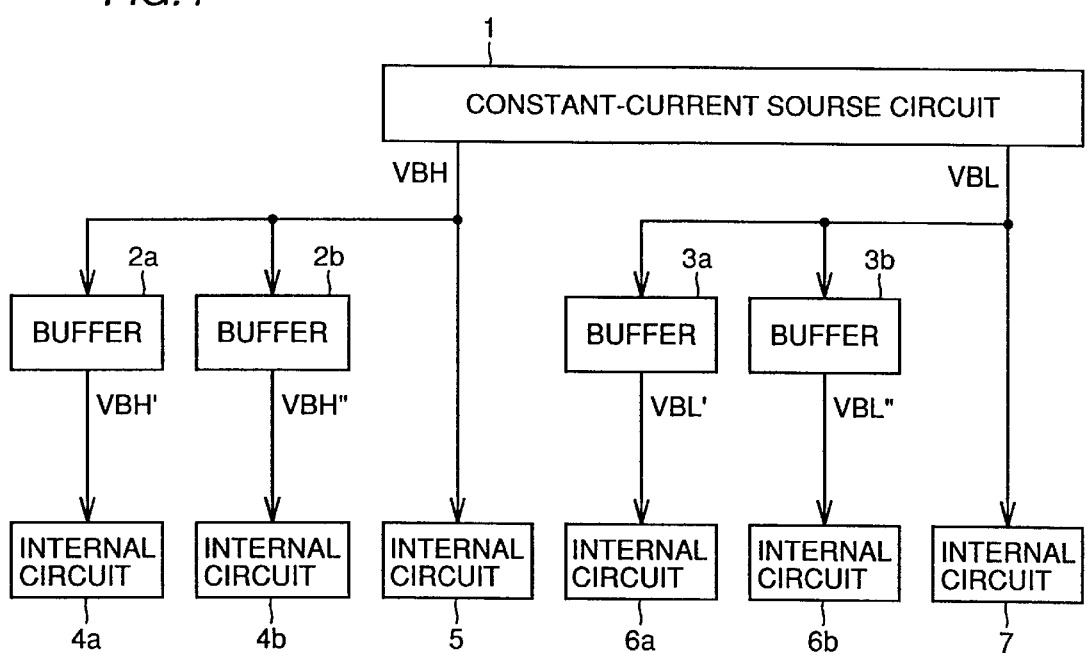
FIG. 4 is a block diagram representing a main portion of a semiconductor integrated circuit device according to a second embodiment of the present invention.

FIG. 4 is a block diagram representing a main portion of a semiconductor integrated circuit device according to the second embodiment of the present invention, and is used in contrast with FIG. 1. This semiconductor integrated circuit device differs from the semiconductor integrated circuit device shown in FIG. 1 in that internal circuit 4 is divided into internal circuits 4a and 4b, and buffers 2a and 2b are provided between a constant-current source circuit 1 and internal circuits 4a and 4b, respectively, and that internal circuit 6 is divided into internal circuits 6a and 6b, and buffers 3a and 3b are provided between constant-current source circuit 1 and internal circuits 6a and 6b, respectively. Buffers 2a, 2b are the same as buffer 2 shown in FIG. 2, and buffers 3a, 3b are the same as buffer 3 shown in FIG. 3.

Internal circuit 4a performs a prescribed operation according to output potential VBH' of buffer 2a, and provides noise to bias potential VBH' line only at power-on. Internal circuit 4b performs a prescribed operation according to output potential VBH" of buffer 2b, and provides noise to bias potential VBH' line only in a certain operating state. The noises generated on bias potential VBH' and VBH" lines are dampened by buffers 2a and 2b, respectively. Thus, the noise generated in either one of internal circuits 4a and 4b is prevented from adversely affecting the other of the internal circuits.

Internal circuit 6a performs a prescribed operation according to output potential VBL' of buffer 3a, and provides noise to bias potential VBL' line only at power-on.

Internal circuit 6b performs a prescribed operation according to output potential VBL" of buffer 3b, and provides noise to bias potential VBL" line only in a certain operating state. The noise generated on bias potential VBL" line is dampened by buffers 3a and 3b, respectively. Thus, the noise generated in either one of internal circuits 6a and 6b is prevented from adversely affecting the other of the internal circuits.

Third Embodiment

When many buffers are provided, the ratio of the through current to the stand-by current in a buffer becomes non-negligible. Moreover, in some cases, the necessity of a buffer cannot be determined without actually evaluating it on-chip. Thus, a configuration is required that can be used to determine whether to utilize a buffer or not by testing after a wafer process.

Figure 5:
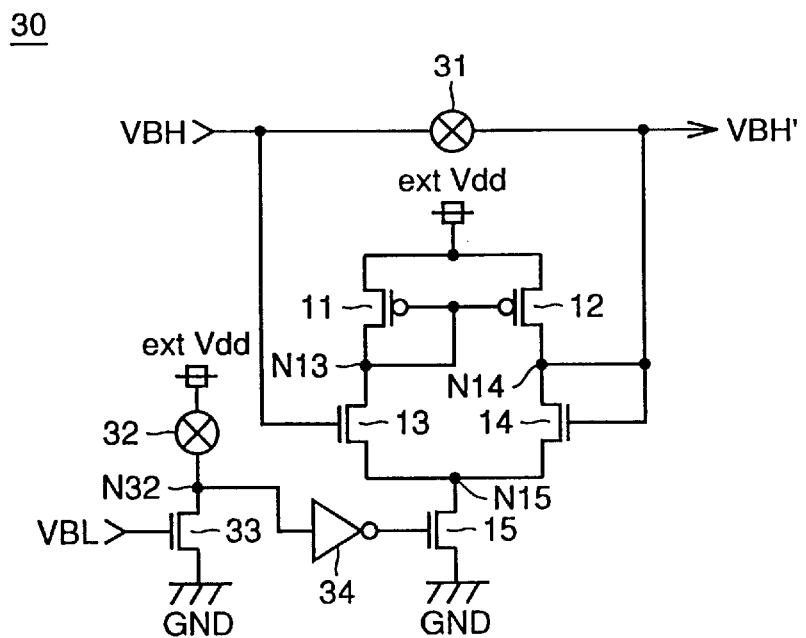
FIG. 5 is a circuit diagram representing a configuration of a buffer 30 of a semiconductor integrated circuit device according to a third embodiment of the present invention.
Figure 6:
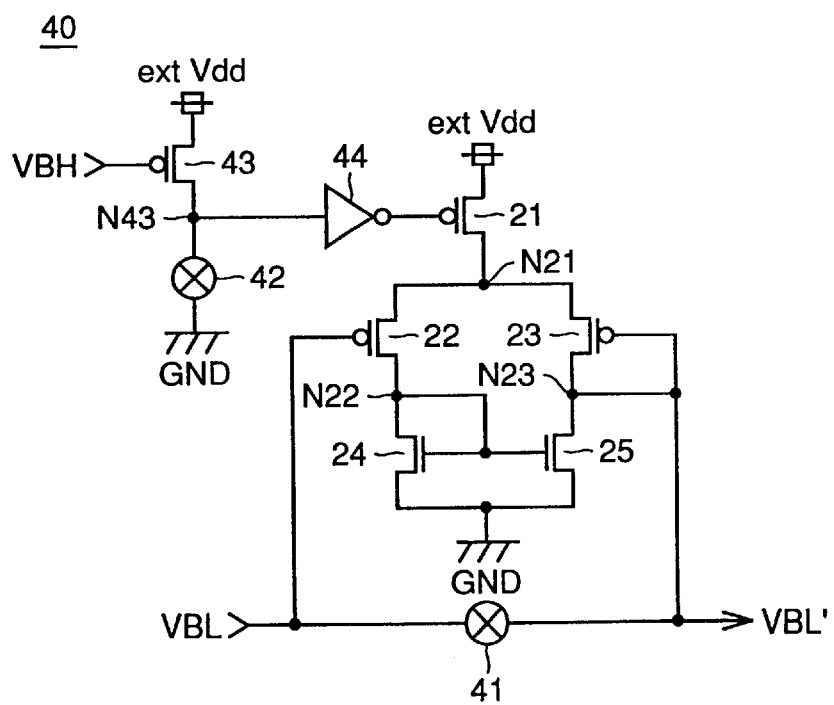
FIG. 6 is a circuit diagram representing a configuration of a buffer 40 included in the semiconductor integrated circuit device described in relation to FIG. 5.

FIGS. 5 and 6 are circuit diagrams representing configurations of buffers 30, 40 of a semiconductor integrated circuit device according to a third embodiment of the present invention. As shown in FIG. 5, buffer 30 differs from buffer 2 in FIG. 2 in that fuses 32, 31, an N-channel MOS transistor 33, and an inverter 34 are additionally provided.

Fuse 31 is connected between a gate of an N-channel MOS transistor 13 and a gate of an N-channel MOS transistor 14. Fuse 32 and N-channel MOS transistor 33 are connected in series between an external power-supply potential extVdd line and a ground potential GND line. The gate of N-channel MOS transistor 33 receives bias potential VBL. N-channel MOS transistor 33 is set to be of a sufficiently small size such that the through current that flows through fuse 32 and N-channel MOS transistor 33 becomes sufficiently small. Inverter 34 is connected between a node N32 between fuse 32 and N-channel MOS transistor 33 and a gate of an N-channel MOS transistor 15. Buffer 30 can, for instance, be replaced by each of buffers 2a, 2b of FIG. 4.

At first, fuses 31, 32 are not blown so that bias potential VBH directly becomes output potential VBH' of buffer 30 through fuse 31. At this time, the current that can flow through fuse 32 is sufficiently greater than the current that flows through N-channel MOS transistor 33 so that node N32 attains the "H" level, and N-channel MOS transistor 15 is rendered non-conductive. Thus, the dissipation current of buffer 30 can be limited to a small value.

Then, the circuit operation is checked by providing a test pattern in which the highest level of noise is likely to be generated. Consequently, if the effect of the noise is determined to be significant, fuses 31 and 32 are blown. Thus, node N32 attains the "L" level and N-channel MOS transistor 15 is rendered conductive, and buffer 30 assumes the same configuration as buffer 2 in FIG. 2. Thus, the noise generated in an internal circuit is dampened by buffer 30, and other circuits are prevented from being adversely affected by the noise.

As shown in FIG. 6, buffer 40 differs from buffer 3 in FIG. 3 in that fuses 41, 42, a P-channel MOS transistor 43, and an inverter 44 are additionally provided. Fuse 41 is connected between a gate of a P-channel MOS transistor 22 and a gate of a P-channel MOS transistor 23. P-channel MOS transistor 43 and fuse 42 are connected in series between an external power-supply potential extVdd line and a ground potential GND line. The gate of P-channel MOS transistor 43 receives bias potential VBH. P-channel MOS transistor 43 is set to be of a sufficiently small size such that the through current that flows through P-channel MOS transistor 43 and fuse 42 becomes sufficiently small. Inverter 44 is connected between a node N43 between P-channel MOS transistor 43 and fuse 42 and a gate of a P-channel MOS transistor 21. Buffer 40 can, for instance, be replaced by each of buffers 3a, 3b of FIG. 4.

At first, fuses 41, 42 are not blown so that bias potential VBL directly becomes output potential VBL' of buffer 40 through fuse 41. At this time, the current that can flow through fuse 42 is sufficiently greater than the current that flows through P-channel MOS transistor 43 so that node N43 attains the "L" level and P-channel MOS transistor 21 is rendered non-conductive. Thus, the dissipation current of buffer 40 can be limited to a small value.

Then, the circuit operation is checked by providing a test pattern in which the highest level of noise is likely to be generated. Consequently, if the effect of the noise is determined to be significant, fuses 41 and 42 are blown. Thus, node N43 attains the "H" level and P-channel MOS transistor 21 is rendered conductive, and buffer 40 assumes the same configuration as buffer 3 in FIG. 3. Thus, the noise generated in an internal circuit is dampened by buffer 40, and other circuits are prevented from being adversely affected by the noise.

As seen from the above, in the third embodiment, since only the buffers 30 and 40 that are determined as necessary for the purpose of dampening the noise can be selectively utilized, wasted dissipation current as well as the stand-by current can be reduced.

In some cases, the evaluation of the necessity of buffers 30, 40 carried out once is sufficient, and does not require checking chip-by-chip. In such cases, instead of switching the activation of buffers 30, 40 by a fuse, a mask may be employed to form an interconnection equivalent to a fuse that is not cut off.

Fourth Embodiment

Often, the period for and the condition under which an internal circuit generates noise are known in advance. For instance, noise is generated for a certain period starting from power-on, or when a chip receives a command. In such cases, the drivability of a buffer can be switched by an appropriate signal for the time during which noise is generated and for the time not having noise generation, thereby suppressing the adverse influences of the noise as well as achieving the reduction in the dissipation current.

Figure 7:
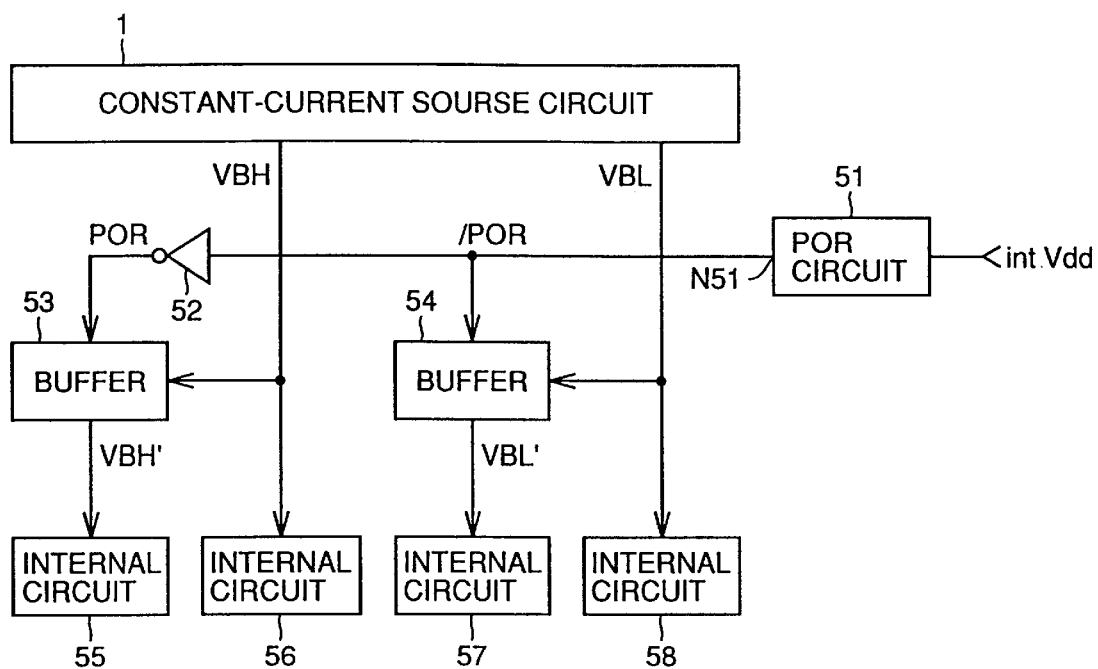
FIG. 7 is a circuit block diagram representing a main portion of a semiconductor integrated circuit device according to a fourth embodiment of the present invention.

FIG. 7 is a diagram representing a main portion of a semiconductor integrated circuit device according to a fourth embodiment of the present invention. As seen in FIG. 7, the semiconductor integrated circuit device is provided with a constant-current source circuit 1, a POR circuit 51, an inverter 52, buffers 53 and 54, and internal circuits 55 to 58. Constant-current source circuit 1 has the same configuration as constant-current source circuit 81 shown in FIG. 15, and generates bias potentials VBH and VBL.

In general, there is a time difference between the time when an external power-supply potential extVdd becomes stable and the time when an internal power-supply potential intVdd becomes sufficiently high. Therefore, POR circuit 51 monitors internal power-supply potential intVdd becoming stable, and when internal power-supply potential intVdd exceeds a certain level, determines that "the state in which the device can operate stably has been achieved after the power-on," and raises the level of an output signal /POR from the "L" level to the "H" level.

Figure 8:
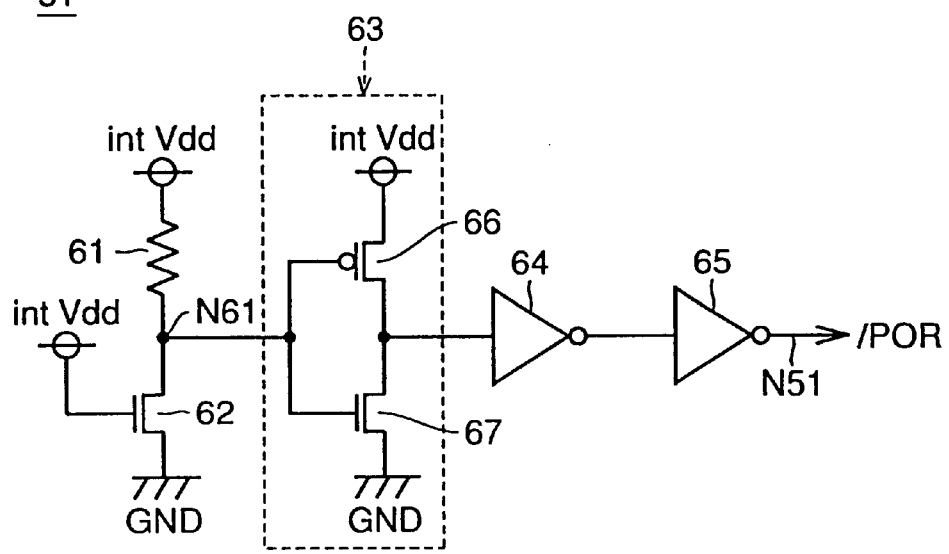
FIG. 8 is a circuit diagram representing a configuration of a POR (Power On Reset) circuit shown in FIG. 7.

POR circuit 51, thus, includes a resistance element 61, an N-channel MOS transistor 62, and inverters 63 to 65 as shown in FIG. 8. Resistance element 61 and N-channel MOS transistor 62 are connected in series between an internal power-supply potential intVdd line and a ground potential GND line, and a gate of N-channel MOS transistor 62 receives an internal power-supply potential intVdd. Each of inverters 63 to 65 includes a P-channel MOS transistor 66 and an N-channel MOS transistor 67 connected in series between an internal power-supply potential intVdd line and a ground potential GND line. Inverters 63 to 65 are connected in series between a node N61 between resistance element 61 and N-channel MOS transistor 62 and an output node N51 of POR circuit 51.

Figure 9:
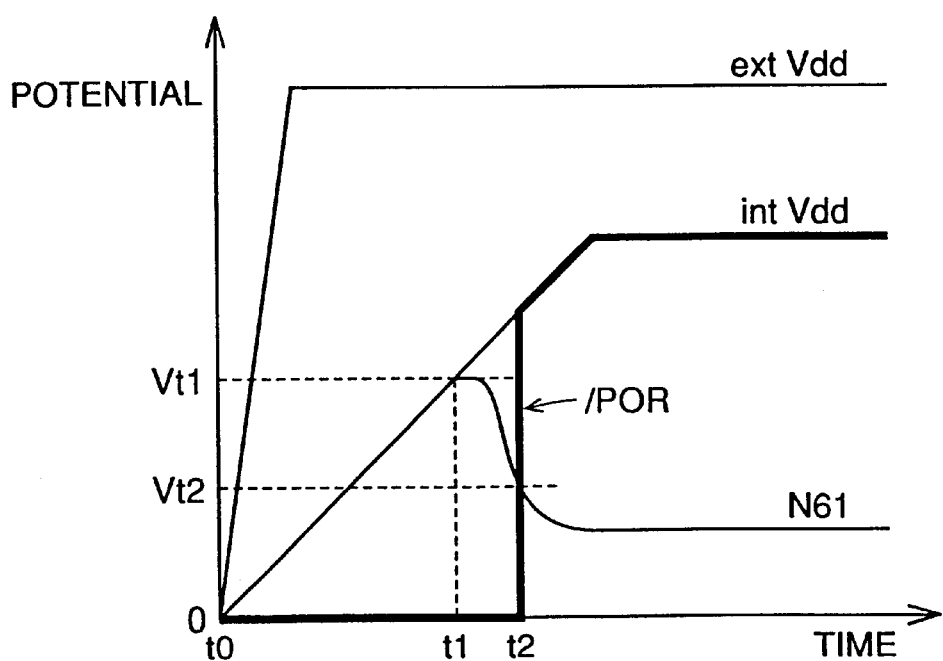
FIG. 9 is a diagram representing an operation of the POR circuit shown in FIG. 8.

FIG. 9 is a diagram representing an operation of POR circuit 51. There is a time difference from the time when an external power-supply potential extVdd becomes stable up to the time when an internal power-supply potential intVdd becomes stable. When the level of an internal power-supply potential intVdd is sufficiently low, N-channel MOS transistor 62 is in its off state, and node N61 is at a level that is substantially the same as an internal power-supply potential intVdd. Therefore, signal /POR is at the "L" level.

When an internal power-supply potential intVdd rises and exceeds a threshold potential Vt1 of N-channel MOS transistor 62 (at time t1), N-channel MOS transistor 62 is turned on, and the level of node N61 is the voltage resulting from the voltage division of internal power-supply potential intVdd between resistance element 61 and N-channel MOS transistor 62. When an internal power-supply potential intVdd rises, the resistance value of N-channel MOS transistor 62 falls, and the level of node N61 falls as well. When the level of node N61 becomes lower than a threshold potential Vt2 of inverter 63 (at time t2), an output of inverter 63 is inverted, causing signal /POR to rises to the "H" level. Signal /POR is input directly into buffer 54 as well as is provided via inverter 52 to buffer 53.

Figure 10:
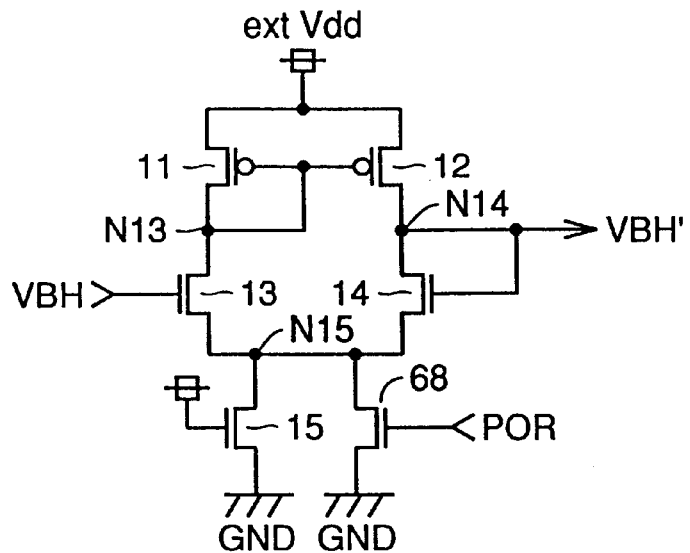
FIG. 10 is a circuit diagram representing a configuration of a buffer 53 shown in FIG. 7.

As shown in FIG. 10, buffer 53 includes an N-channel MOS transistor 68 in addition to buffer 2 of FIG. 2. N-channel MOS transistor 68 is connected between a node N15 and a ground potential GND line, and receives signal POR at a gate. The W/L ratio (or channel width/channel length ratio) of N-channel MOS transistor 68 is set at a larger value than the W/L ratio of an N-channel MOS transistor 15.

The drivability of buffer 53 becomes greater corresponding to the through current of buffer 53, and the through current of buffer 53 is determined by N-channel MOS transistors 15 and 68. During the period in which signal POR is at the "H" level, N-channel MOS transistor 68 is turned on so that the through current of buffer 53 becomes large, making the drivability of buffer 53 greater. During the period in which signal POR is at the "L" level, N-channel MOS transistor 68 is turned off so that the through current of buffer 53 becomes small, making the drivability of buffer 53 smaller.

Figure 11:
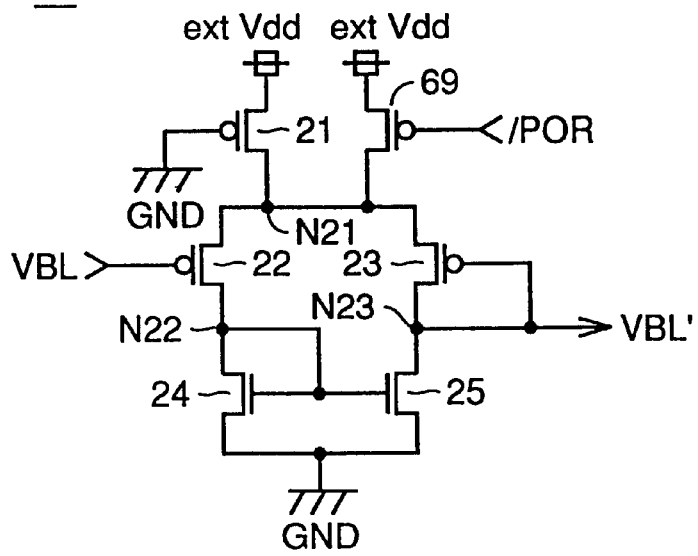
FIG. 11 is a circuit diagram representing a configuration of a buffer 54 shown in FIG. 7.

As shown in FIG. 11, buffer 54 includes a P-channel MOS transistor 69 in addition to buffer 3 of FIG. 3. P-channel MOS transistor 69 is connected between an external power-supply potential extVdd line and a node N21, and receives signal /POR at a gate. The W/L ratio of P-channel MOS transistor 69 is set at a larger value than the W/L ratio of a P-channel MOS transistor 21.

The drivability of buffer 54 becomes greater corresponding to the through current of buffer 54, and the through current of buffer 54 is determined by P-channel MOS transistors 21 and 69. During the period in which signal /POR is at the "L" level, P-channel MOS transistor 69 is turned on so that the through current of buffer 54 becomes large, making the livability of buffer 54 greater. During the period in which signal /POR is at the "H" level, P-channel MOS transistor 69 is turned off so that the through current of buffer 54 becomes small, making the drivability of buffer 54 smaller.

Internal circuit 55 performs a prescribed operation according to an output potential VBH' of buffer 53. Noise is generated on a bias potential VBH' line when internal circuit 55 is in operation, and particularly, a large amount of noise is generated during the time from the provision of an external power-supply potential extVdd up to the time when an internal power-supply potential intVdd attains a prescribed level (time t0 to time t2). This noise is dampened by buffer 53. Internal circuit 56 performs a prescribed operation according to a bias potential VBH generated in constant-current source circuit 1. No noise is generated on a bias potential VBH line even when internal circuit 56 is in operation.

Internal circuit 57 performs a prescribed operation according to an output potential VBL' of buffer 54. Noise is generated on a bias potential VBL' line when internal circuit 57 is in operation, and particularly, a large amount of noise is generated during the time from the provision of an external power-supply potential extVdd up to the time when an internal power-supply potential intVdd attains a prescribed level (time t0 to time t2). This noise is dampened by buffer 54. Internal circuit 58 performs a prescribed operation according to a bias potential VBL generated in constant-current source circuit 1. No noise is generated on a bias potential VBL line even when internal circuit 58 is in operation.

Now, an operation of the semiconductor integrated circuit device will be described briefly. During the time from the provision of an external power-supply potential extVdd up to the time when an internal power-supply potential intVdd attains a prescribed level (time t0 to time t2), signal /POR attains the "L" level, and the through currents of buffers 53 and 54 become larger, thereby achieving a higher drivability of buffers 53 and 54. At this time, the large noise that is generated in internal circuits 55 and 57 is dampened by buffers 53 and 54 having the high drivability.

Moreover, when internal power-supply potential intVdd exceeds a prescribed level (from time t2 onward), signal /POR attains the "H" level, and the through currents of buffer 53 and 54 become smaller, thereby making the drivability of buffers 53 and 54 lower. At this time, small amount of noise that is generated in internal circuits 55 and 57 is dampened by buffers 53 and 54 having the low drivability.

Thus, in this embodiment, the noise generated in internal circuits 55, 57 is prevented from adversely affecting constant-current source circuit 1 and other internal circuits 56 and 58 as well as internal circuits 55 and 57 themselves, and the increase in the dissipation current can be kept small.

Figure 12:
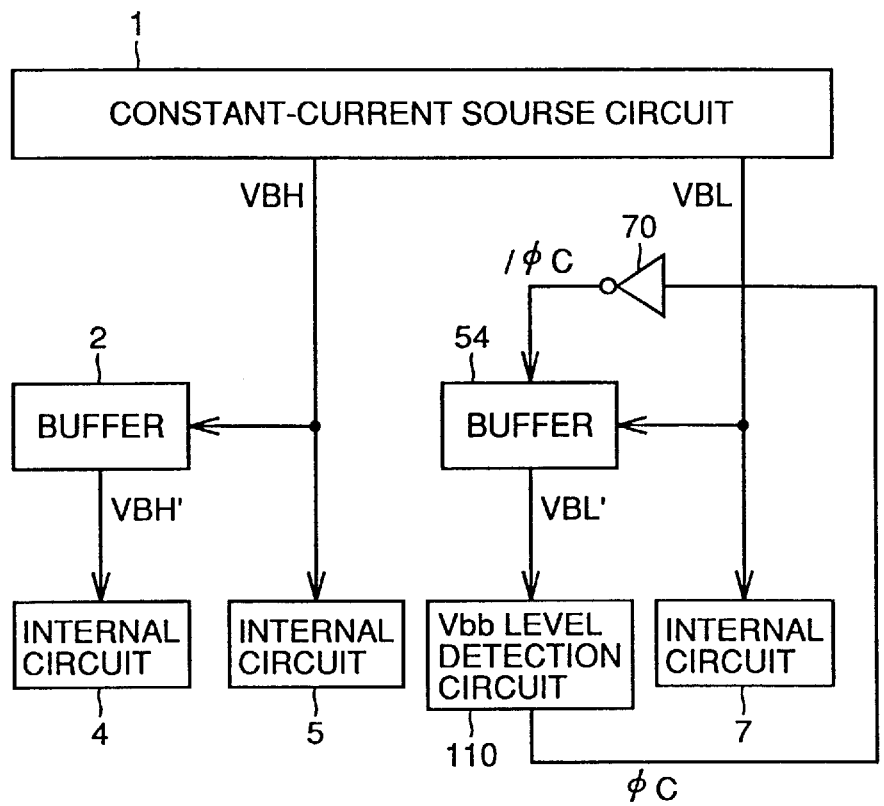
FIG. 12 is a circuit block diagram representing a modification of the fourth embodiment.

FIG. 12 is a circuit block diagram representing a modification of the fourth embodiment. As seen in FIG. 12, this semiconductor integrated circuit device differs from the semiconductor integrated circuit device of FIG. 1 in that buffer 3 and internal circuit 6 are respectively replaced by a buffer 54 and a Vbb level detection circuit 110 and that an inverter 70 is additionally provided. Buffer 54 has the same configuration as the one shown in FIG. 11, and Vbb level detection circuit 110 has the same configuration as the one shown in FIG. 16. An output signal φC of Vbb level detection circuit 110 is inverted by inverter 70. An output signal /φC of inverter 70 is input into a gate of a P-channel MOS transistor 69 of a buffer 54 in place of signal /POR. An output potential VBL' of buffer 54 is input into the gates of N-channel MOS transistors 113, 117 of Vbb level detection circuit 110 instead of bias potential VBL.

When a substrate potential Vbb is higher than a target potential, output signal φC of Vbb level detection circuit 110 attains the active level or the "H" level, thereby activating a charge pump circuit, and substrate potential Vbb falls. At this time, noise is generated on a bias potential VBL' line via a parasitic capacitance of N-channel MOS transistor 113 in Vbb level detection circuit 110. At the same time, however, the drivability of buffer 54 becomes larger so that the noise generated on bias potential VBL' line is dampened by buffer 54. In this modification, the noise generated in Vbb level detection circuit 110 is prevented from adversely affecting other circuits, and the increase in the dissipation current can be kept small.

Fifth Embodiment

In general, a constant current Ic that flows through a constant current source circuit 1 is a very small current of about 1 $\mu$A. In addition, when the stand-by current is taken into consideration, the through current of a buffer employed in the first to fourth embodiments is also set at about few $\mu$A. Thus, even if the drivability of a buffer matches the noise, the response speed of the circuit becomes slower, and overshoots and undershoots are produced, causing a dramatic variation in the buffer output.

Figure 13:
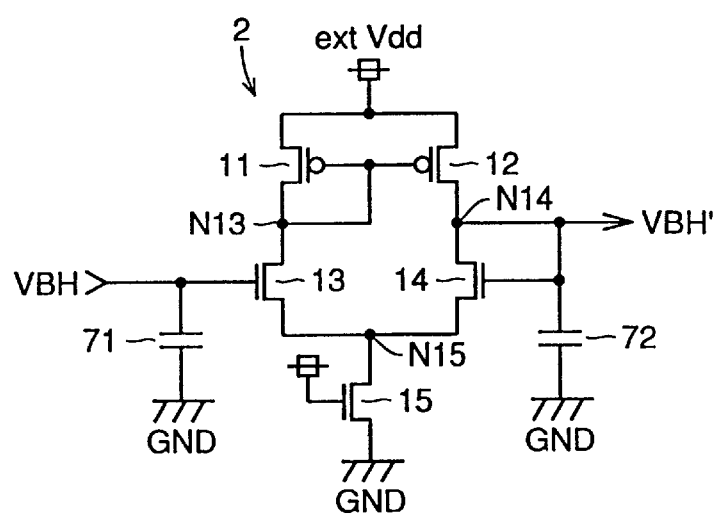
FIG. 13 is a circuit diagram representing a main portion of a semiconductor integrated circuit device according to a fifth embodiment of the present invention.
Figure 14:
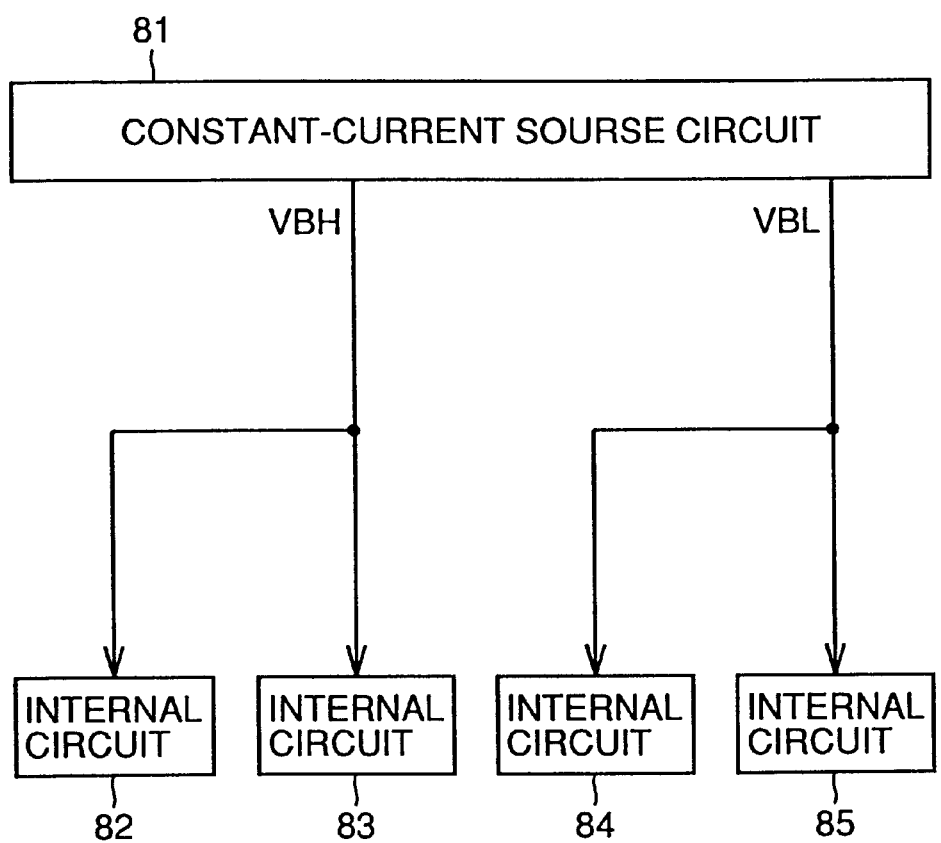
FIG. 14 is a block diagram representing a main portion of a conventional semiconductor integrated circuit device.

In order to prevent this problem, capacitors 71 and 72 for stabilizing the levels are respectively provided between an input node and an output node of each buffer and a ground potential GND line. In FIG. 13, capacitors 71 and 72 are respectively provided between an input node of buffer 2 (a gate of an N-channel MOS transistor 13) and an output node. N14 and a ground potential GND line.

Thus, in this embodiment, the inadequacy of the buffer response speed is compensated for in order to achieve the stabilization of the buffer operation. Further, if one of the capacitors 71 and 72 is unnecessary, only the one required may be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a constant-current source circuit for generating a constant current of a predetermined value and for outputting a bias potential of a value according to the constant current;
   a buffer circuit for receiving at an input node an output potential of said constant-current source circuit and controlling a potential of an output node such that said output node attains a same potential as said input node; and
   an internal circuit for generating a current of a value corresponding to said constant current in accordance with an output potential of said buffer circuit to perform a prescribed operation based on the current generated.

2. The semiconductor device according to claim 1, further comprising a setting circuit for selectively setting a path to provide the bias potential output from said constant-current source circuit to said internal circuit via said buffer circuit or a path to provide the bias potential directly to said internal circuit without an intervention of said buffer circuit.

3. The semiconductor device according to claim 2, wherein said setting circuit includes a first fuse connected between the input node and the output node of said buffer circuit, and a second fuse for activating said buffer circuit by being blown.

4. The semiconductor device according to claim 1, wherein drivability of said buffer circuit can be switched between at least two levels of high and low; and
   said semiconductor device further comprises a control circuit for setting the drivability of said buffer circuit at a high level during a noise generation period of said internal circuit, and at a low level during other times.

5. The semiconductor device according to claim 4, wherein the noise generation period of said internal circuit is a period from a time when an external power-supply potential is provided to said semiconductor device up to a time when an internal power-supply potential attains a predetermined potential level.

6. The semiconductor device according to claim 4, being formed on a semiconductor substrate, and further comprising:

a potential detection circuit for detecting whether a potential of said semiconductor substrate exceeds a predetermined target potential and for outputting an activating signal when the predetermined target potential has not been exceeded; and a charge pump circuit for supplying charges to said semiconductor substrate in response to the activating signal from said potential detection circuit, wherein the noise generation period of said internal circuit is a period during which the activating signal is output from said potential detection circuit.

7. The semiconductor device according to claim 1, further comprising a first capacitor and a second capacitor respectively connected to the input node and the output node of said buffer circuit.

8. The semiconductor device according to claim 1, wherein said buffer circuit includes a first transistor having an input electrode connected to said input node, a second transistor having an input electrode and a first electrode connected to said output node, a current mirror circuit connected between a first power-supply potential line and first electrodes of said first and second transistors for providing to said output node a current having a same value as a current that flows through said first transistor, and a resistance element connected between second electrodes of said first and second transistors and a second power-supply potential line.

9. The semiconductor device according to claim 1, wherein a plurality of internal circuits are provided, said plurality of internal circuits are divided into a plurality of groups according to noise generation period and/or types of noise generated respectively, and said buffer circuit is provided corresponding to each of said plurality of groups, and transmits an output potential of said constant-current source circuit to each internal circuit belonging to a corresponding group.

* * * * *